US008507029B2

(12) United States Patent
Temchenko et al.

(10) Patent No.: US 8,507,029 B2
(45) Date of Patent: Aug. 13, 2013

(54) BACKING SHEET FOR PHOTOVOLTAIC MODULES

(75) Inventors: Marina Temchenko, Swampscott, MA (US); David William Avison, Townsend, MA (US); Frank Anthony Mannarino, Medway, MA (US); Samuel Lim, Lynn, MA (US)

(73) Assignee: Madico, Inc., Woburn, MA (US)

( * ) Notice: Subject to any disclaimer, the term of this patent is extended or adjusted under 35 U.S.C. 154(b) by 345 days.

(21) Appl. No.: 12/855,192

(22) Filed: Aug. 12, 2010

(65) Prior Publication Data

US 2011/0045193 A1    Feb. 24, 2011

Related U.S. Application Data

(63) Continuation-in-part of application No. 12/011,962, filed on Jan. 30, 2008.

(60) Provisional application No. 60/901,982, filed on Feb. 16, 2007.

(51) Int. Cl.
B05D 5/12    (2006.01)

(52) U.S. Cl.
USPC ............... 427/74; 427/407.1; 204/192.15

(58) Field of Classification Search
USPC ............... 427/74, 407.1; 204/192.15
See application file for complete search history.

(56) References Cited

U.S. PATENT DOCUMENTS

| | | | |
|---|---|---|---|
| 4,456,647 A | 6/1984 | Schonfelder | |
| 4,578,526 A | 3/1986 | Nakano et al. | |
| 5,482,571 A | 1/1996 | Yamada et al. | |
| 5,530,264 A | 6/1996 | Kataoka et al. | |
| 5,578,141 A | 11/1996 | Mori et al. | |
| 5,582,653 A | 12/1996 | Kataoka et al. | |
| 5,597,422 A | 1/1997 | Kataoka et al. | |
| 5,718,772 A | 2/1998 | Mori et al. | |
| 6,194,098 B1 | 2/2001 | Ying et al. | |
| 6,207,236 B1 | 3/2001 | Araki et al. | |
| 6,236,061 B1* | 5/2001 | Walpita | 257/40 |
| 6,268,558 B1 | 7/2001 | Kubota | |
| 6,335,479 B1 | 1/2002 | Yamada et al. | |
| 6,372,870 B1 | 4/2002 | Kitahara et al. | |
| 6,422,777 B1 | 7/2002 | Landrau et al. | |
| 6,452,089 B1 | 9/2002 | Kubota | |
| 8,445,097 B2 | 5/2013 | Kourtakis et al. | 428/212 |
| 2002/0050286 A1 | 5/2002 | Kubota | |
| 2003/0035917 A1* | 2/2003 | Hyman | 428/67 |
| 2006/0020082 A1 | 1/2006 | Rautschek et al. | |
| 2006/0280922 A1 | 12/2006 | Hull et al. | |
| 2007/0154704 A1 | 7/2007 | Debergalis et al. | |
| 2008/0264484 A1* | 10/2008 | Temchenko et al. | 136/256 |
| 2008/0289681 A1* | 11/2008 | Adriani et al. | 136/251 |
| 2008/0289682 A1* | 11/2008 | Adriani et al. | 136/251 |
| 2009/0078314 A1* | 3/2009 | Temchenko et al. | 136/256 |
| 2011/0108086 A1 | 5/2011 | Temchenko et al. | |
| 2011/0256392 A1* | 10/2011 | Takanashi | 428/347 |
| 2012/0006388 A1* | 1/2012 | Mori | 136/251 |
| 2012/0006401 A1* | 1/2012 | Takanashi et al. | 136/256 |
| 2012/0006407 A1* | 1/2012 | Takanashi et al. | 136/259 |
| 2012/0012164 A1* | 1/2012 | Sugiura et al. | 136/251 |
| 2012/0012165 A1* | 1/2012 | Takanashi et al. | 136/251 |
| 2012/0024377 A1* | 2/2012 | Takanashi et al. | 136/259 |
| 2012/0031474 A1* | 2/2012 | Mori | 136/251 |
| 2012/0034460 A1* | 2/2012 | Tamada | 428/355 N |
| 2012/0318344 A1* | 12/2012 | Zhao et al. | 136/256 |

FOREIGN PATENT DOCUMENTS

| | | |
|---|---|---|
| EP | 1938967 A1 | 2/2008 |
| JP | 2000138388 | 8/1987 |
| JP | 06350117 | 12/1994 |
| JP | 08330618 | 12/1996 |
| JP | 10156993 | 6/1998 |
| JP | 10256580 | 9/1998 |
| JP | 10284745 | 10/1998 |
| JP | 2000031509 | 1/2000 |
| JP | 2000114565 | 4/2000 |
| JP | 62007767 | 5/2000 |
| JP | 2000141531 | 5/2000 |
| JP | 2000307137 | 11/2000 |
| JP | 2003152212 | 5/2003 |
| JP | 2003251765 | 9/2003 |
| JP | 2003253120 | 9/2003 |
| JP | 2004137408 | 5/2004 |
| JP | 2004214342 | 7/2004 |

(Continued)

OTHER PUBLICATIONS

Cuddihy, Coulbert, Liang, Gupta, Willis, Baum; Applications of Ethylene Vinyl Acetate as an Encapsulation Material for Terrestrial Photovoltaic ModulesPrepared by the Jet Propulsion Laboratory, California Institute of Technology, for the U.S. Department of Energy through an agreement with the National Aeronautics and Space Administration JPL Publication 83-35; DOE/JPL-1012-87; Apr. 15 1983; pp. 1-71.
English language Abstract for JP 2009 170772 A.
English language Abstract for JP 2009 170770 A.
Miyazaki, Nobuyuki; Takayanagi, Takashi; Characteristic Properties and Application of Lumiflon 300 as Coating on FRP; Reprinted from Asahi Garasu Kenkyu Hokoku, Reports of Research Laboratory, Asahi Glass Col., Ltd.; 1986, pp. 155-166, vol. 36, No. 1.
"Halogenated Resins Lead to High Levels of Anti-Corrosion," Polym. Paint Colour J. Journal; Dec. 10-24, 1986; pp. 938, 942, 944, and 946; Issue No. 0370-1158; vol. 176, No. 4181.
Bescher, E. et al.; "Long-Term Protection of the Last Judgement Mosaic in Prague;" Journal of Sol-Gel Science and Technology; Dec. 2000, pp. 215-218; vol. 19, Nos. 1-3.

(Continued)

Primary Examiner — Douglas McGinty
(74) Attorney, Agent, or Firm — Finch & Maloney PLLC

(57) ABSTRACT

A protective backing sheet for photovoltaic modules is provided. The backing sheet has a layer including fluoropolymer which is cured on a substrate, and the layer includes boron nitride. The amount of boron nitride contained in the layer is within the range of 2 to 30.0% by weight, and preferably in the range of 5 to 10%. Also, the layer including fluoropolymer may further include a titanium dioxide.

11 Claims, 4 Drawing Sheets

(56) References Cited

FOREIGN PATENT DOCUMENTS

| | | |
|---|---|---|
| JP | 2004300319 | 10/2004 |
| JP | 2004307666 | 11/2004 |
| JP | 2004352966 | 12/2004 |
| JP | 2009 170770 A | 7/2009 |
| JP | 2009 170772 A | 7/2009 |
| JP | 2009170770 | 7/2009 |
| JP | 2009170772 | 7/2009 |
| JP | 2010212496 | 9/2010 |
| JP | 2010212633 | 9/2010 |
| JP | 2010219196 | 9/2010 |
| JP | 2010232232 | 10/2010 |
| JP | 2010232233 | 10/2010 |
| JP | 2010232294 | 10/2010 |
| JP | 2010232441 | 10/2010 |
| JP | 2010232442 | 10/2010 |
| JP | 2010232463 | 10/2010 |
| JP | 2010232513 | 10/2010 |
| JP | 2010238714 | 10/2010 |
| JP | 2010238759 | 10/2010 |
| JP | 2010238760 | 10/2010 |
| JP | 2010238790 | 10/2010 |
| JP | 2011124428 | 6/2011 |
| JP | 2011159913 | 8/2011 |
| JP | 2011176192 | 9/2011 |
| JP | 2011176193 | 9/2011 |
| JP | 2011181671 | 9/2011 |
| JP | 2011181732 | 9/2011 |
| JP | 2011204880 | 10/2011 |
| JP | 2011204881 | 10/2011 |
| WO | 9750130 | 12/1997 |
| WO | WO 2004/099306 | 11/2004 |
| WO | WO2004099306 | 11/2004 |
| WO | 2005017017 A1 | 2/2005 |
| WO | 2008143719 A2 | 11/2008 |
| WO | 2009097024 A1 | 8/2009 |
| WO | WO 2010/116635 | 10/2010 |
| WO | WO 2010/116649 | 10/2010 |
| WO | WO 2011/004872 | 1/2011 |
| WO | WO 2011/118727 | 9/2011 |

OTHER PUBLICATIONS

Munekata, Seiji; "Flouropolymers as Coating Material;"Progress in Organic Coatings; Reports of the Research Laboratory, Asahi Glass Co., Ltd.; 1988; pp. 113-134, vol. 16.

Takaura, Teruo; CTFE/ Vinyl Ether Copolymers; In Modern Fluoropolymers, Scheirs, J., Ed. Wiley Interscience: New York, 1997; Chap. 29, pp. 557-564.

Munekata, Seiji et al.; "Characteristic Properties of LUMIFLON as a Coating Material;" Reprinted from Asahi Garasu Kenkyu Hokoku (Reports of the Research Laboratory, Asahi Glass Co., Ltd.); 1984, pp. 205-224, vol. 34, No. 2.

\* cited by examiner

GRAPH SHOWING WVTR WITH RESPECT TO THE AMOUNT OF SILICA ADDED WHEN THAT OF TITANIUM DIOXIDE IS FIXED TO 25.3% BY WEIGHT

BACKING SHEET FOR PHOTOVOLTAIC MODULES

CROSS REFERENCE TO RELATED APPLICATION

This application is a Continuation In Part of U.S. patent application Ser. No. 12/011,962, filed Jan. 30, 2008, which claims the benefit of U.S. Provisional Patent Application No. 60/901,982, filed Feb. 16, 2007, the entirety of which is hereby incorporated into this application.

BACKGROUND OF THE INVENTION

1. Field of the Invention

The present invention relates to photovoltaic modules. More specifically the present invention related to the protective backing sheets.

2. Description of Related Art

Solar energy utilized by photovoltaic modules is among the most promising alternatives to the fossil fuel that is being exhausted this century. However, production and installation of the photovoltaic modules remains an expensive process. Typical photovoltaic modules consist of glass or flexible transparent front sheet, solar cells, encapsulant, protective backing sheet, a protective seal which covers the edges of the module, and a perimeter frame made of aluminum which covers the seal. As illustrated in FIG. 1, a front sheet 10, backing sheet 20 and encapsulant 30 and 30' are designed to protect array of cells 40 from weather agents, humidity, mechanical loads and impacts. Also, they provide electrical isolation for people's safety and loss of current. Protective backing sheets 20 are intended to improve the lifecycle and efficiency of the photovoltaic modules, thus reducing the cost per watt of the photovoltaic electricity. While the front sheet 10 and encapsulant 30 and 30' must be transparent for high light transmission, the backing sheet must have high opacity for aesthetical purposes and high reflectivity for functional purposes. Light and thin solar cell modules are desirable for a number of reasons including weight reduction, especially for architectural (building integrated PV) and space applications, as well as military applications (incorporated into the soldier outfit, etc). Additionally light and thin modules contribute to cost reduction. Also reduction in quantity of consumed materials makes the technology "greener", thus saving more natural resources.

One means to manufacture light and thin solar cells is to incorporate light and thin backing sheets. The backside covering material however, must also have some moisture resistance to prevent permeation of moisture vapor and water, which can cause rusting in underlying parts such as wires, and electrodes, and damage solar cells. In addition, backing sheets should provide electric isolation, mechanical protection, some UV stability, adherence to the encapsulant and ability to attach output leads.

Currently used protective backing sheets are typically laminates. FIG. 2 provides an illustration of a typical laminate backing sheet 20. The laminate consists of films of polyvinylfluorides 22, which is most commonly Tedlar®, polyesters (PET) 24, and copolymers of ethylene vinyl acetate (EVA) 26 as key components. The EVA layer 26 bonds with the encapsulant layer 30 in the module and serves as a dielectric layer and has good moisture barrier properties. It is dimensionally stable. White EVA allows significant power boost. The polyester layer 24 is very tough, has excellent dielectric properties, is dimensionally stable, and also has good moisture barrier properties. The polyvinylfluoride layer 22 serves as a very weatherable layer.

Even though these films have met performance standards in the required tests and during actual use, they exhibit certain limitations such as high cost and limited availability of the Tedlar® films. Another drawback of prior art materials such as PVF (Tedlar®), ECTFE (Halar®) and other fluoropolymers, is that such materials cannot be processed at ambient or moderately elevated temperatures. For example, PVF film is produced by a casting process from dispersion, using high boiling solvents (usually dimethyl acetamide for oriented Tedlar® and propylene carbonate for cast Tedlar®). The boiling point of dimethyl acetamide is 164-166° C. and the boiling point of propylene carbonate is 200° C. The dispersion must be processed at 160° C. and 90% of solvent content or greater to ensure adequate film formation. Higher temperatures are unacceptable due to PVF resin thermal instability: its fusion and decomposition temperatures are so close, that PVF can decompose during the baking. As a result, there is always a residual solvent in Tedlar® film. DuPont reports that residual amounts of dimethyl acetamide (DMAC) ranging from 0.05 to 1.0 wt % will be present in all oriented Tedlar® PVF films.

Alternatively, ECTFE (Halar®) films are produced by melt extrusion at 350° C.-375° C. As a result, they cannot be easily compounded with pigments, clays, etc. and are also expensive.

U.S. Pat. No. 5,741,370 suggests that manufacturing and module mounting costs could be reduced by using, as the backskin material, a thermoplastic olefin comprising a combination of two different ionomers, e.g., a sodium ionomer and a zinc ionomer, with that combination being described as producing a synergistic effect which improves the water vapor barrier property of the backskin material over and above the barrier property of either of the individual ionomer components. Also, the patent discloses use of an ionomer encapsulant with the dual ionomer backskin.

However, National Renewable Energy Laboratory (NREL) reports that ionomer resins contain free and bound methacrylic acid, which requires using stainless steel tooling during melt processing, thus increasing the manufacturing costs. PVMaT Improvements in the Solarex Photovoltaic Module Manufacturing Technology Annual Subcontract Report May 5, 1998-Apr. 30, 1999, National Renewable Energy Laboratory, January 2000 • NREL/SR-520-27643.

SUMMARY OF THE INVENTION

The present invention provides a protective backing sheet for photovoltaic modules. The backing sheets of the current invention possess excellent weather resistance, heat resistance, color retention, adhesion between layers and encapsulant, and scratch resistance. The backing sheet can minimize the deterioration in the performance of the solar module due to moisture permeation. It also can achieve desirable photoelectric conversion efficiency over a long period of time. Additionally the described backing sheet, or alternately referred to backskin, can be made in an aesthetically pleasing form.

The backing sheets of the present invention are produced by utilizing liquid coatings application technology, followed by lamination with EVA, and can be tailored according to the application requirements. Furthermore, advantages of solar cell modules utilizing the described backskin material include a significant reduction in manufacturing costs.

The liquid coatings formulations used in the backskins overcome one or more of the deficiencies of the prior art backskins. The backskin can be made thinner than currently available backskins. The backing materials include more readily available materials which can be processed at ambient or moderately elevated temperatures. These liquid coatings can be applied directly on the second layer of laminate, thus eliminating the need for an adhesive. Additionally, they can be easily compounded with additives such as pigments, clays, etc.

In one aspect, a backing sheet for a photovoltaic module is described having a layer comprising an organic solvent soluble, crosslinkable amorphous fluoropolymers. The fluoropolymer may be a fluorocopolymer of chlorotrifluoro ethylene (CTFE) and one or more alkyl vinyl ethers, including alkyl vinyl ethers with reactive OH functionality. The backing sheet can include a crosslinking agent mixed with the flourocopolymer.

The backing sheet may also include additional layers, such as a polyester layer. For another example, the backing sheet of may also include an EVA layer. Other optional additional layers may include one or of coextruded polyester with EVA, of coextruded polyester with ionomer, polycarbonate, polyolefin, polyurethane, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate.

The fluorocopolymer layer of the backing sheet can be applied to the polyester layer, or other type of layer with or without an adhesive. Also, it can be applied as a single layer or multiple layers. In one embodiment, the fluorocopolymer layer has a thickness of less than 1 mil. In another aspect, the fluorocopolymer has a layer that is greater than 1 mil. In another embodiment, the backing sheet includes silica.

In one embodiment, the fluorocopolymer layer includes boron nitride. The addition of boron nitride functions to enhance the adhesion of the fluorocopolymer layer to the polyester layer or other type of layer to form a backing sheet. The boron nitride is especially useful in enhancing adhesion when the backing sheet is exposed to weather elements.

In another aspect of the invention, a backing sheet for a photovoltaic module is described. The backing sheet has a layer comprising a copolymer of tetrafluoroethylene (TFE) and hydrocarbon olefins with reactive OH functionality. The backing sheet may further include a crosslinking agent mixed with the flourocopolymer. In one embodiment the fluorocopolymer layer has a thickness of less than 1 mil. In another embodiment, the fluorocopolymer layer has a thickness of greater than 1 mil. In another embodiment, the backing sheet also has an ionomer layer.

In another aspect of the invention, a backing sheet for a photovoltaic module is described. The backing sheet has a layer comprising a polyvinylidene fluoride. The backing sheet may further include a crosslinking agent mixed with the fluorocopolymer. In one embodiment the fluorocopolymer layer has a thickness of less than 1 mil. In another embodiment, the fluorocopolymer layer has a thickness of greater than 1 mil. In another embodiment, the backing sheet also has an ionomer layer.

The fluorocopolymer may be or include a terpolymer of one or more fluoromonomers. In one embodiment the terpolymer comprises vinylidene fluoride, tetrafluoroethylene, and hexafluoropropylene.

Again, the backing sheet may also include additional layers, such as a polyester layer. The fluorocopolymer layer may be applied to the polyester layer with or without adhesive. The fluorocopolymer layer may be applied as a single layer or as a combination of clear and pigmented multiple layers. The polyester film can be additionally corona or chemically treated to improve adhesion. In one embodiment, boron nitride is added to the fluorocopolymer coating formulation. The addition of boron nitride significantly improves adhesion of the coating to the additional substrate layers, especially a polyester substrate. The boron nitride, for example, the powder form from ZypCoatings, is preferably added in an amount from about 2.5% -12% by weight, and more preferably from about 5-10% by weight. The backing sheet may also include an EVA layer.

In another embodiment the backing sheet contains silica. Other optional additional layers may include one or more of polycarbonate, coextruded polyester with EVA, polyolefin, polyurethane, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate, sputtered aluminum oxide Lumiflon®, sputtered aluminum oxide Zeffle®, sputtered silicon oxide or silicon nitride Lumiflon, sputtered silicon oxide or silicon nitride Zeffle.®

In another aspect, a method of repairing the backing sheet of a photovoltaic module is provided. The method includes the step of applying a formulation comprising an amorphous fluorocopolymer of chlorotrifluoroethylene (CTFE) with one or more alkyl vinyl ethers, including alkyl vinyl ethers with reactive OH functionality to an area on the backing sheet in need of repair. In one embodiment the formulation is applied to the backing sheet at ambient temperature or moderately elevated temperature. In another embodiment, the formulation is comprised of a first and second component that are placed in a twin-chamber syringe equipped with static mixer and applied through an applicator attached to the syringe.

In one embodiment the first component of the formulation is comprised of a mixture of a crosslinker and a solvent, and the second component is comprised of a mixture of a solvent and a fluorocopolymer.

In another aspect of the invention, another backing sheet for a photovoltaic module is described. The backing sheet has a layer comprising fluoropolymer which is cured on a substrate, and the layer comprising fluoropolymer includes hydrophobic silica.

In one embodiment the substrate may be made of polyster resin, and the hydrophobic silica may be surface-treated with a polydimethyl siloxane polymer. The amount of silica contained in the layer comprising fluoropolymer is in the range of 2.5 to 15.0% by weight, and preferably in the range of 7.5 to 12.5%. Also, the layer comprising fluoropolymer may further include a titanium dioxide.

BRIEF DESCRIPTION OF THE DRAWINGS

For a better understanding of the present invention, reference may be made to the accompanying drawings.

DETAILED DESCRIPTION

Figure 1:
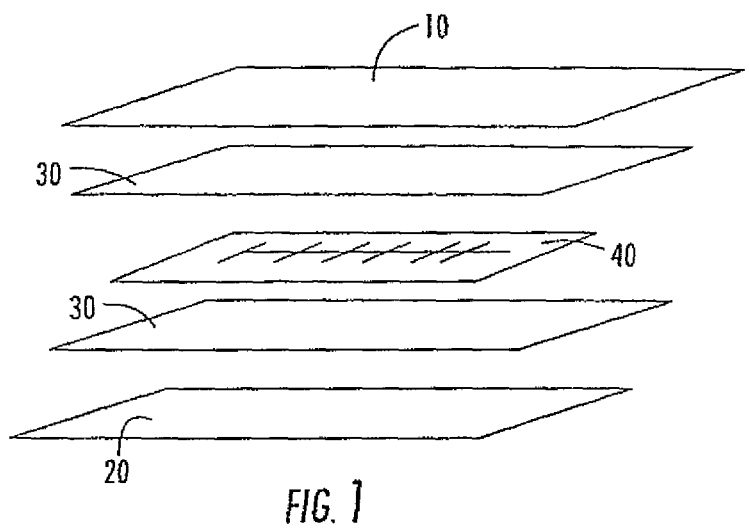
FIG. 1 represents an expanded view of the components of a typical photovoltaic module.
Figure 2:
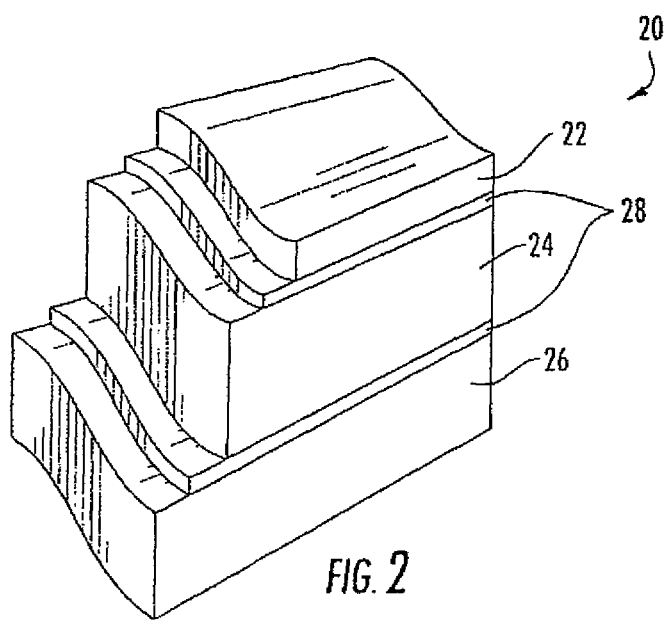
FIG. 2 represents one embodiment of the typical backing sheet.

The present invention provides a protective backing sheet for photovoltaic modules. In one embodiment, the backing sheets are produced by utilizing liquid coatings application technology. In the preferred embodiment the liquid coating application is followed by lamination with EVA. The process can be tailored according to the application requirements.

In another embodiment, an encapsulating material is provided. The encapsulating material has excellent weather resistance, heat resistance, and UV stability, adhesion to backing material and to other components of solar module, electrical isolation and excellent color retention without yellowing. The described encapsulating material is applied by spraying, thus eliminating vacuum lamination process at elevated temperatures and reducing the manufacturing costs.

In another aspect methods for quick and easy repair of torn or otherwise damaged backskin are provided using a "patch kit". The method and patch kit allow for fast application of aesthetically pleasing, robust coating over scratched backing sheet without using extreme temperatures and pressures. Also, such "patch kit" allows for fast and efficient repair "in-situ". The coating of the patch kit applied in accordance with the method of the present invention meet all the requirements of IEC 60664-1, TEC 61730, IEC 1646, and ASTM F1249. In the preferred embodiment of this aspect of the invention, the "patching" formulation is applied by using a twin-chamber syringe equipped with static mixer and applicator.

The liquid coatings formulations used in the present invention can be applied at ambient temperature or moderately elevated temperature. The primary component of the liquid coatings formulations are fluoropolymers, and preferably organic solvent soluble or water dispersible, crosslinkable amorphous fluoropolymers.

Non-limiting examples of fluoropolymers that may be used in the present invention include a fluorocopolymer of chlorotrifluoroethylene (CTFE), such as Lumiflon® (Asahi Glass Co., Ltd.), Cefral Coat® (Central Glass Co. Ltd), and Fluonate® (DIC Corporation); a tetrafluoroethylene (TFE) polymer, such as Zeffle® (Daikin Industries, LTD); and polymers having a fluoroalkyl group and comprising a flruoalkyl unit, such as Zonyl® (E.I. du Pont de Nemours and Company) and Unidyne® (Daikin Industries, LTD) and polyvinylidene fluoride.

Among these, CTFE and TFE are preferable from the viewpoint that they are excellent in dispersibility of a pigment, weather resistance, copolymerizability and chemical resistance. Examples of fluoroolefin polymers having a curable functional group include a copolymer of TFE, isobutylene, hydroxybutyl vinyl ether and another monomer, and a copolymer of TFE, VdF, hydroxybutyl vinyl ether and another monomer. Non-limiting examples of the other copolymerizable monomer are, for example, vinyl esters of carboxylic acid such as vinyl acetate, vinyl propionate, vinyl butyrate, vinyl isobutyrate, vinyl pivalate, vinyl caproate, vinyl versatate, vinyl laurate, vinyl stearate, vinyl cyclohexyl carboxylate, and vinyl benzoate; alkyl vinyl ethers such as methyl vinyl ether, ethyl vinyl ether, butyl vinyl ether and cyclohexyl vinyl ether; and fluorine-containing monomers such as chlorotrifluoroethylene (CTFE), vinyl fluoride (VF), vinylidene fluoride (VdF), and fluorinated vinyl ether.

Preferred components of coatings include fluorocopolymers with the following structure:

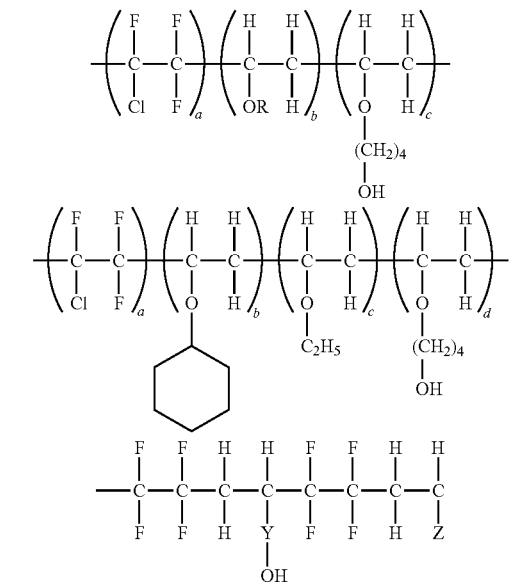

Fluoropolymers that can be utilized in the liquid formulations include, but is not limited to, Lumiflon® (Asahi Glass) and Zeffle® (Daikin). Other materials include FluoroPel™ and FluorThane™ (Cytonix Corporation), FluoroLink™ Polymer Modifiers (Solvay Solexis). Additional components in the liquid coating formulations include crosslinking agents, catalysts, solvents, and optionally, fillers and inorganic materials such as boron nitride (Zyp Coatings).

One particularly preferred fluoropolymer is Lumiflon®, developed by Asahi Glass in 1982. Lumiflon® is an amorphous fluorocopolymer of chlorotrifluoroethylene (CTFE) with several specific alkyl vinyl ethers (VE).

A combination of the alkyl vinyl ether monomers and hydroxyl groups provides the polymer with significant properties, such as solubility, compatibility to pigment, crosslinking reactivity, adhesiveness to the substrate, hardness and flexibility.

Another preferred fluoropolymer is Zeffle® resins (Daikin), which are copolymers of tetrafluoroethylene (TFE) and hydrocarbon olefins that are organic solvent soluble. More particularly, Zeffle® is a solvent-based, copolymer of tetrafluoroethylene and hydrocarbon olefins with reactive OH functionality formulated for use as a base resin in high performance paints and coatings.

In another embodiment, the fluoropolymer is a terpolymer. The terpolymer may contain one or more different fluoromonomers. For one example, the terpolymer contains vinylidene fluoride, tetrafluoroethylene, and hexafluoropropylene. Dyneon™ THV is one such terpolymer and provides a combination of performance advantages, such as low processing temperature, ability to bond to elastomers and hydrocarbon-based plastics, flexibility and optical clarity. As a clear film it can be used as a front sheet to replace glass. The addition of pigment provides a film that can be used as a backing sheet for a photovoltaic module.

Organic solvents which may be used in this invention for the formation of the liquid coating formulations include but are not limited to organic solvents such as methyl ethyl ketone (MEK), acetone, methyl isobutyl ketone (MIBK), toluene, xylene, methanol, isopropanol, ethanol, heptane, ethyl acetate, isopropyl acetate, n-butyl acetate, n-butyl alcohol or mixtures thereof. Preferred solvents include xylene, cyclohexanone and methyl ethyl ketone (MEK). The appropriate solvent is one in which all components dissolve and one in which the boiling point is low enough to minimize or remove the presence of residual solvent in the coating.

Optional pigments and fillers which may be used in this invention for the formation of the protective coatings include but are not limited to titanium dioxide, carbon black, Perylene pigments, pigments, dyes, mica, polyamide powders, boron nitride, zinc oxide, aluminum oxide, silica, UV absorbers, corrosion inhibitors, and desiccants. One preferred pigment is titanium dioxide Ti-Pure® R-105(DuPont), which is a rutile titanium dioxide pigment treated with $SiO_2$ for durability. One preferred hydrophobically modified silica is Cab-o-Sil TS 720 (Cabot Corporation), which is a fumed silica treated with a dimethyl silicone to replace the surface hydroxyl groups with a polydimethyl-siloxane polymer. Pigments, UV absorbers and corrosion inhibitors function to impart opacity and weatherability. Orgasol® Ultrafine is a preferred polyimide powders (Arkema Inc) and can be included for gloss reduction. Carbon black, pigments and dyes can be included to alter the color of the backing sheet. Mica can be included to impart flame retardancy. Boron nitride, aluminum nitride, and/or aluminum oxide can be included to improve thermal conductivity. Cloisite® Nanoclays (Southern Clay Products), 3M™ Glass Bubbles and desiccants are preferably included to improve moisture barrier properties. Silica and/or boron nitride can be included to improve dielectric properties. Silica may also be included to reduce gloss and to impart flame retardancy.

Crosslinking agents are preferably used in the formation of the protective coatings include to obtain organic solvent insoluble, tack-free film. Preferred crosslinking agents include but are not limited to DuPont Tyzor® organic titanates, silanes, isocyanates, and melamine. Aliphatic isocyanates are preferred to ensure weatherability as these films are typically intended for over 30 years use outdoor.

For one example, liquid formulations for Lumiflon®-based coatings compositions can be prepared by mixing a Lumiflon® solution, pigment, crosslinker and a catalyst. Tin dibutyl dilaureate, is used to accelerate the crosslinking reaction between Lumiflon (polyol) and isocyanate in an organic solvent. Such compositions are prepared by mixing preferably 3 to 80, and even more preferably around 46 parts by weight of Lumiflon® solution, 5 to 60 (more preferably around 17) parts by weight of pigment, and 20 to 80 (more preferably around 32) parts by weight of organic solvent (a mixture of MEK and xylene or cyclohexanone).

The backing sheet may also include additional layers. The additional layers may be applied to the fluorocopolymer layer with or without adhesive. The optional additional layers may include, for example, one or of polyester, EVA, polycarbonate, polyolefins, polyurethanes, acrylics, polyimides, polyamides, liquid crystal polymer, aclar, aluminum, of sputtered aluminum oxide polyester, sputtered silicon oxide or silicon nitride polyester, sputtered aluminum oxide polycarbonate, and sputtered silicon oxide or silicon nitride polycarbonate, clear fluoropolymers and clear fluorocopolymers, coextruded layer of a polymers such as polyester and EVA, and polybutadiene.

In one embodiment, boron nitride is added to the fluorocopolymer coating formulation. The addition of boron nitride significantly improves adhesion of the coating to the additional substrate layers, especially a polyester substrate. The boron nitride, for example, the powder form from ZypCoatings, is preferably added in an amount from about 2.5% -12% by weight, and more preferably from about 5-10% by weight. Boron Nitride (BN) is a powder which is easily dispersible. It is used to enhance thermal conductivity and dielectric strength. The material is chemically inert, corrosion and oxidation resistant, non-toxic, has low coefficient of thermal expansion.

When added to the coating formulation, the boron nitride significantly improves adhesion to the substrate layer when the coating is exposed to weather elements. Samples were tested to determine the adhesive effects of the addition of boron nitride over time. The tests show that the addition of boron nitride significantly improves the adhesion as a function of time. That is, the addition of boron nitride maintains the adhesion between the coating and the substrate over time, whereas without boron nitride, the adhesion would deteriorate. This effect is especially pronounced when the backing sheets are exposed to whether elements.

Identical samples were prepared in the same manner with the exception that one set of samples had various levels boron nitride added to the coating and one set of control samples that had no boron nitride. The samples were prepared as follows: a flurocopolymer formulation in accordance with the invention, Lumiflon LF 200 grade, obtained from Asahi Glass (43% solids) was used to produce the control sample (no boron nitride and samples with 2.5%, 5% and 9% by weight of boron nitride loading on a Pilot coater. The samples were coated on two separate samples of 5 mil polyester sheets (Mylar A and Hosthaphan 2307N) at 10 fpm, 250° F., followed by lamination with EVA.

The samples were exposed to Damp Heat (85° C. 85% Relative Humidity) for 2000 hours and also in Heat-Humidity-Freeze (HHF) at (85° C. 85% RH-40° C.) for 50 cycles.

The Damp Heat test was carried out in accordance with the IEC 61215. The material was placed into an environmental chamber (Espec) and exposed to elevated temperature and relative humidity (85° C., 85% RH) for the duration of 2000 hours. HFH was performed in new CZZ Z8plus (Test Equity) environmental chamber according to UL 1703 for the duration of 50 cycles. Adhesion between outer layer (the fluorocopolymer layer) and PET layer was evaluated by cross-cut tape test ASTM D 3359-97, which is a standard test method for Measuring Adhesion by Tape Test. The test classifies adhesion as follows: 5B=0% of coating removed, 4B—less than 5% of coating removed, 3B—5-15% of coating removed, 2B 15-35% of coating removed, 1B 35-65% of coating removed and 0B greater than 65% of coating removed.

The initial classification for both the control and boron nitride modified samples was 5B. After 2000 hrs, adhesion of to PET to the fluoropolymer layer of the control (unmodified with boron nitride) was 1B for the Mylar A sample and 0B for the Hostaphan 2307N sample. In contrast, the adhesion of samples modified with boron nitride (the 5% and 9% boron nitride was 4B for the Mylar A sample and 2B for the Hostaphan 2307N sample.

Similar results were obtained for the HFH cycle samples. After 50 cycles in HFH cycler, adhesion of the fluorocopolymer formulation to PET without boron nitride (the control samples) was measured to be 1B for the Mylar A sample and 0B for the Hostaphan 2307N sample. In contrast, the adhesion of samples modified with boron nitride (the 5% and 9% boron nitride was 3B for the Mylar A sample. For the Hostaphan 2307N sample, the adhesion was measured to be 3B for the 9% sample and 2B for the 5% and 2.5% sample.

These tests illustrates that boron nitride significantly improves the adhesion of the coating to the substrate when exposed to weather elements.

The following examples are illustrative of the certain embodiments of the invention.

Example 1

Example 1 illustrates the preparation of a Lumiflon®-based protective backing sheet according to the present invention. Lumiflon® used in this example is LF 200 grade, obtained from Asahi Glass as a 60% solution in xylene (200 g). Pigment used in this example is Ti-Pure® R-105, obtained from DuPont (76.2 g). The crosslinker is Desmodur®N3300, obtained from Bayer (21.4 g), which is a hexamethylene diisocyanate trimer. The pigment is mixed with Lumiflon® solution using high shear mixer, followed by solvent and the crosslinker addition.

The formulation is then applied. The liquid formulation is transferred from the pan to the film by applicator roll and metered off by Mayer Rod to obtain the desired coating weight. The coating is applied directly on a Mylar® A (DuPont) (5 mil) polyester film. No adhesive is required and in this example none is used. The coating is applied at a coating weight of 10-120 g/m$^2$, preferably 30-90 g/m$^2$, and more preferably 30-45 g/m$^2$.

The dry coating consists of 60-65% by weight of Lumiflon® and 35% by weight of pigment. In this example, the polyester film coated with Lumiflon®-based formulation is laminated with EVA (vinyl acetate content 4%) using polyester-urethane laminating adhesive. The laminate is then vacuum laminated with an EVA encapsulant and module.

Table 1 show the properties of Lumiflon® and Zeffle® based protective backing sheets as compared to a backing sheet prepared with Tedlar® SP.

TABLE 1

| Sample | Thickness μm | Thickness of outer layer μm | Water Vapor Transmission Test | g/(100 in2 · day) 100 F 100% RH | Partial Discharge Test | Voltage max, VDC |
|---|---|---|---|---|---|---|
| Tedlar ® SP/ Polyester/EVA | 178 | 25.4 | ASTM F1249 | 0.195 | IEC 60994-1, IEC 61730 | 820 |
| Lumiflon ®/ Polyester/EVA | 165 | 12.7 | ASTM F1249 | 0.174 | IEC 60994-1, IEC 61730 | 860 |
| Zeffle ®/Polyester/ EVA | 165 | 12.7 | ASTM F1249 | 0.143 | IEC 60994-1, IEC 61730 | 860 |

Table 2 show the properties of Lumiflon® based protective backing sheets as compared to a backing sheet prepared with oriented Tedlar®.

TABLE 2

| Sample | Thickness μm | Thickness of outer layer μm | Water Vapor Transmission Test | g/(100 in2 · day) 100 F 100% RH | Partial Discharge Test | Voltage max, VDC |
|---|---|---|---|---|---|---|
| Tedlar ®/ Polyester/EVA | 267 | 38 | ASTM F1249 | 0.12 | IEC 60994-1, IEC 61730 | 1020 |
| Lumiflon ®/ Polyester/EVA | 241 | 13 | ASTM F1249 | 0.12 | IEC 60994-1, IEC 61730 | 1015 |

The results illustrate that Lumiflon® and Zeffle®-based coatings at a 0.5 mil thickness demonstrate superior barrier properties (lower moisture permeability and higher voltage resistance) than non-oriented Tedlar® SP at a thickness of 1 mil, which is twice the thickness of the Lumiflon® and Zeffle® layers. Additionally, the Lumiflon® based backing sheets are more cost-effective than the Tedlar® based backing sheets.

Table 3 illustrates the weatherability of Lumiflon® based protective backing sheets as compared to a backing sheet prepared with oriented Tedlar®. Samples were placed into an environmental chamber at conditions of 85° C. and 85% Relative Humidity ("Damp Heat") for 2000 hrs. The weatherability of the outer layer was estimated by measuring adhesion between outer layer and polyester, tensile strength and elongation at break as a function of exposure to "Damp Heat" according to ASTM D 903-98 peel adhesion test, ASTM D 3359 cross cut tape adhesion test, and ASTM D882. The following abbreviations in Table 3 apply: TB is tear bond; 5B=0% of coating removed; 4B =less than 5% of coating removed; 3B=5-15% of coating removed; 2B=15-35% of coating removed; 1B=35-65% of coating removed; and 0B=greater than 65% of coating removed.

TABLE 3

| | HOURS | | | |
|---|---|---|---|---|
| OUTER LAYER | 500 | 1000 | 1500 | 2000 |
| Tedlar ® 38 μm | TB | TB | TB | TB |
| Lumiflon ® 13 μm | 5B | 5B | 5B | 4B |

As illustrated in Table 3, the weatherability of thin Lumiflon®-based back sheet is comparable to one of oriented Tedlar®-based back sheet.

Figure 3:
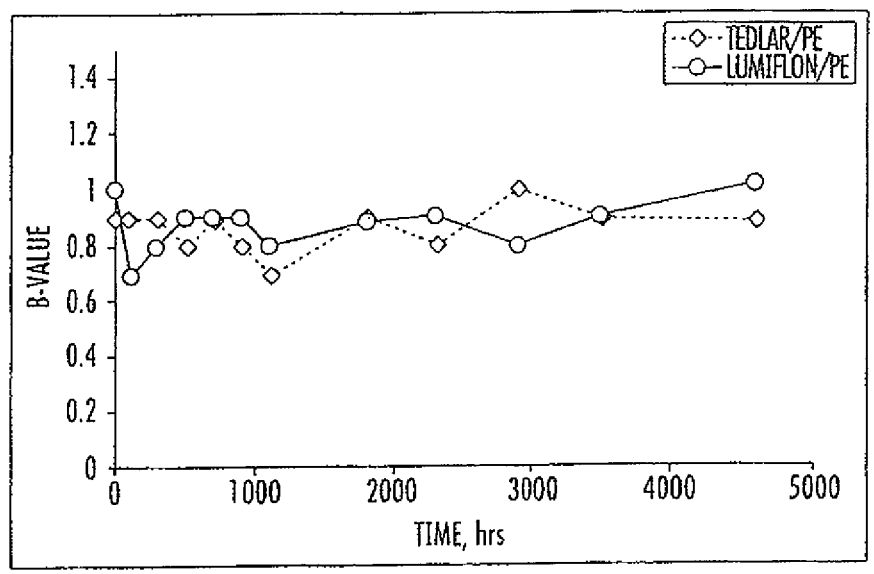
FIG. 3 is a graph showing UV stability of Lumiflon-based back sheet as compared to Tedlar-based back sheet.

To evaluate UV stability, samples were placed into the Atlas ci 4000 Xenon Weather-Ometer, equipped with Xenon Arc Lamp for duration of 4600 hrs, measuring L*a*b* regularly. b*-value represents "yellowing" of the material. As is represented in FIG. 3, UV stability of Lumiflon®-based back sheet is comparable to Tedlar®-based back sheet.

Example 2

Example 2 illustrates the preparation of an alternate embodiment of a Lumiflon®-based protective backing sheet according to the present invention. Lumiflon® used in Example 2 is LF 200 grade, obtained from Asahi Glass Co. Ltd. as a 60% solution in xylene (150 g). Pigment used in this example is Ti-Pure® R-105, obtained from DuPont (57 g). Hydrophobically modified silica used in this example is Cab-o-sil TS-720 (10 g) obtained from Cabot Corporation. The crosslinker used is Desmodur® N3300, obtained from Bayer (16 g). The catalyst used in this example is dibutyl tin dilaureate (0.15 g of 0.1% solution in MEK) obtained from Aldrich. The pigment and silica are mixed with Lumiflon® solution using high shear mixer, followed by solvent, crosslinker and catalyst addition.

The formulation is then applied. The liquid formulation is transferred from the pan to the film by applicator roll and metered off by Mayer Rod to obtain the desired coating weight. The coating is applied directly on a Mylar® (DuPont) (5 mil) polyester film. No adhesive is required and in this example none is used. The coating is applied at a coating weight of 10-120 g/m$^2$, preferably 30-90 g/m$^2$, and more preferably 30-45 g/m$^2$.

TABLE 4

| Sample | Thickness μm | Thickness of outer layer μm | Water Vapor Transmission Test | g/(100 in2 · day) 100 F 100% RH | Partial Discharge Test | Voltage max, VDC |
|---|---|---|---|---|---|---|
| Lumiflon ®/ Polyester/EVA | 241 | 13 | ASTM F1249 | 0.12 | IEC 60994-1, IEC 61730 | 1015 |
| Lumiflon ®/silica/ Polyester/EVA | 241 | 13 | ASTM F1249 | 0.12 | IEC 60994-1, IEC 61730 | 1060 |

As illustrated in Table 4, Example 2, which includes the addition of silica, results in 45 V (max permissible voltage) increase over the Lumiflon® based back sheet without silica, and in 40V increase over Tedlar® based back sheet.

Example 3

Example 3 illustrates the effects of hydrophobic silica on water vapor transmission rate (WVTR) according to another embodiment of the present invention.

Preparation of Coating:

A liquid formulation was prepared including Lumiflon® LF-200 (Asahi Glass Co., Ltd., OH value 52, N.V. 60 wt %), CAB-O-SIL® TS-720 (Cabot Corporation), Ti-Pure® R-105 (DuPont), Desmodur® N3300 (Bayer) as a crosslinker, and dibutyl tin dilaureate as a catalyst in methyl ethyl ketone (MEK). When preparing the formulation, the ratio of solid content of Lumiflon®: Desmodur N3300: dibutuyl tin dilaureate, respectively, was adjusted to be 100: 17.78 0.00016, and CAB-O-SIL TS-720 and TiPure R-105 were diluted with MEK so that the solid content thereof after their addition became the values shown in Table 5.

Subsequently, on a polyethylene terephthalate (PET) film, which was subjected to a peeling treatment, the formulation was applied by using a roll coater so that the coating weight after drying became 60 g/m$^2$. The coated film was dried at 120° C. for 2 minutes, and the coating was cured at room temperature for one week. Then, the coating was peeled off from the PET film, and the water vapor transmission rate of each of the coating obtained was measured in accordance with JIS K7129 based on a humidity sensor method (40° C., 90% RH) using LYSSY water vapor permeability tester L80-5000.

TABLE 5

| Run | Hydrophobic silica (wt %) | Titanium dioxide (wt %) | WVTR [g/m$^2$ * 24 hr] |
|---|---|---|---|
| 1 | 0.0 | 0.0 | 98 |
| 2 | 2.5 | 0.0 | 91 |
| 3 | 5.0 | 0.0 | 89 |
| 4 | 7.5 | 0.0 | 80 |
| 5 | 10.0 | 0.0 | 78 |
| 6 | 12.5 | 0.0 | 82 |
| 7 | 15.0 | 0.0 | 94 |
| 8 | 0.0 | 12.5 | 93 |
| 9 | 0.0 | 25.3 | 91 |
| 10 | 0.0 | 37.9 | 88 |
| 11 | 0.0 | 50.5 | 100 |
| 12 | 2.5 | 25.3 | 80 |
| 13 | 5.0 | 25.3 | 78 |
| 14 | 7.5 | 25.3 | 75 |
| 15 | 10.0 | 25.3 | 72 |
| 16 | 12.5 | 25.3 | 78 |
| 17 | 15.0 | 25.3 | 84 |

Figure 5:
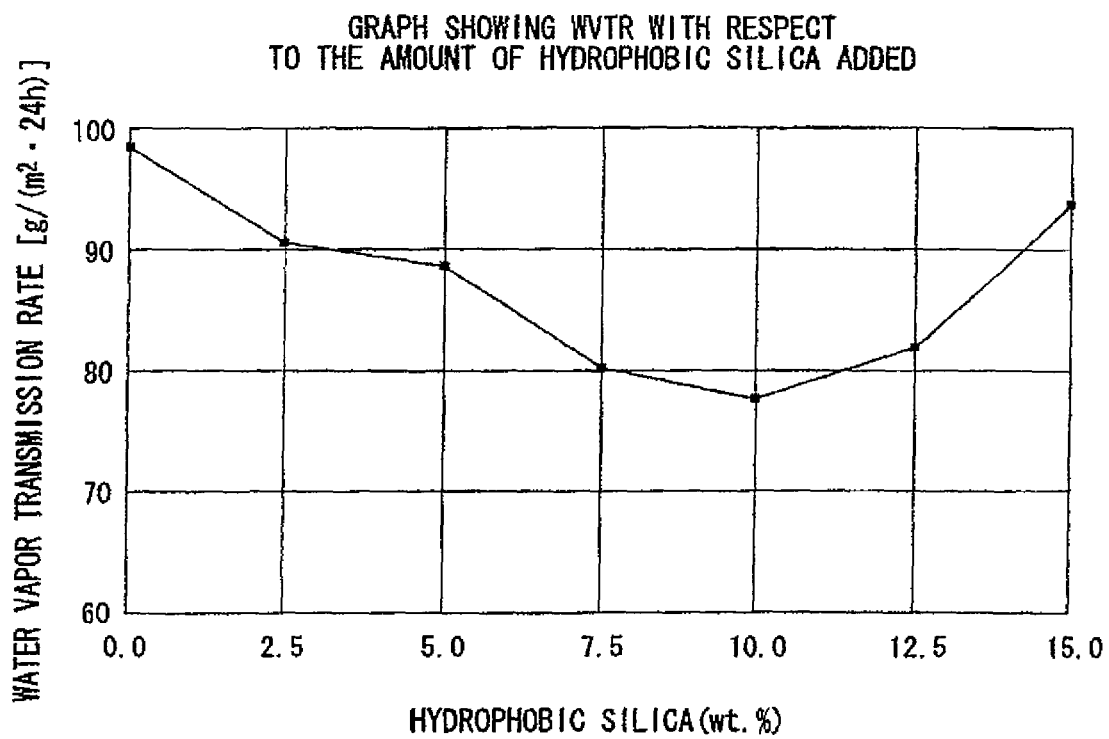
FIG. 5 is a graph showing Water Vapor Transmission Rate (WVTR) with respect to the amount of hydrophobic silica added.
Figure 6:
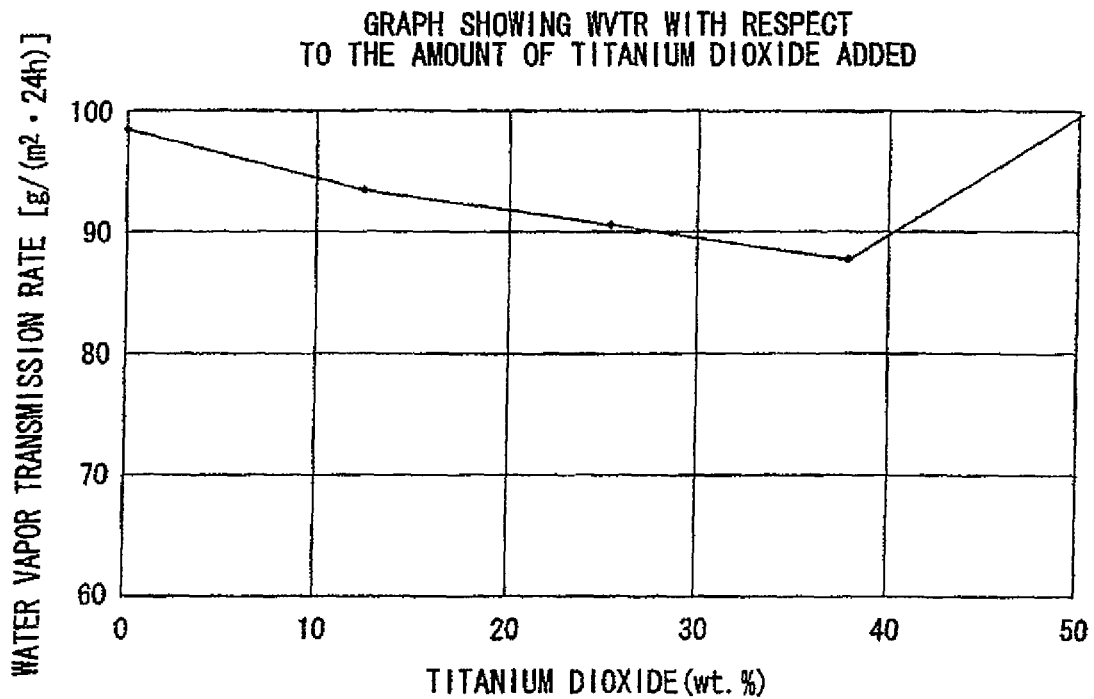
FIG. 6 is a graph showing WVTR with respect to the amount of titanium dioxide added.
Figure 7:
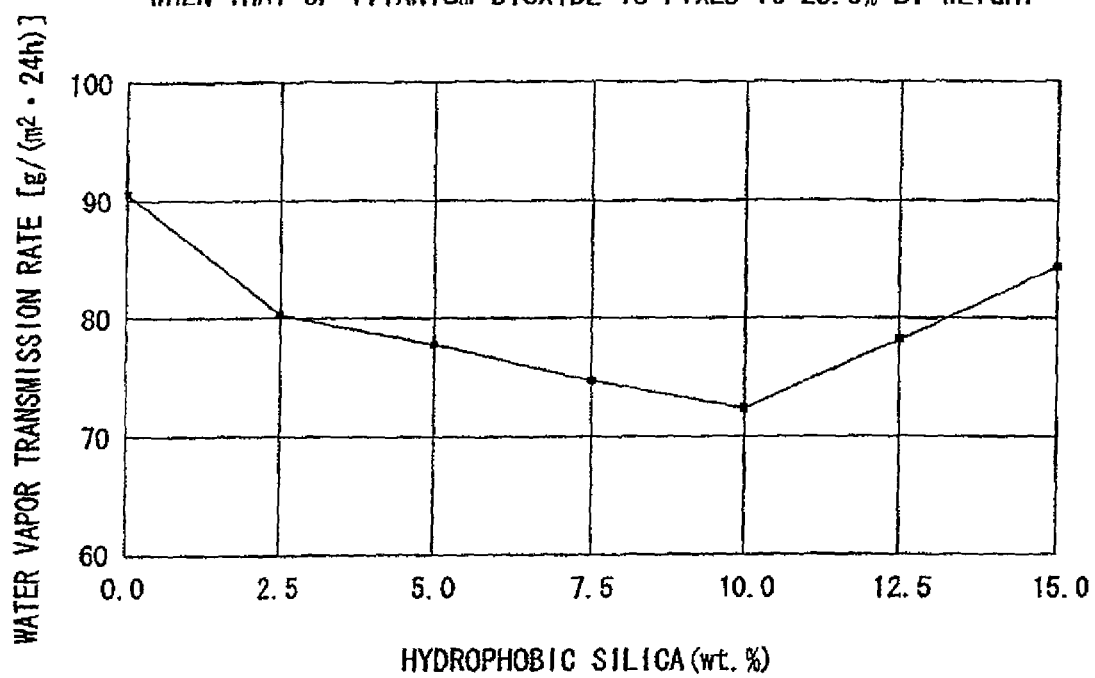
FIG. 7 is a graph showing WVTR with respect to the amount of silica added when that of titanium dioxide is fixed to 25.3% by weight.

As shown in Runs 1-7 in Table 5 in which the effect of the amount of hydrophobic silica added to the coating on the water vapor transmission rate was determined without adding titanium dioxide, it was found that the WVTR was significantly reduced by the addition of hydrophobic silica to the coating. The results are clear from the graph shown in FIG. 5, The effect of addition of titanium dioxide to the coating, on the other hand, was also determined by carrying out the same procedure without adding hydrophobic silica as shown in Runs 8-11. The results are shown in the graph in FIG. 6. This shows that although the addition of titanium dioxide has some effects on the reduction of WVTR, the degree thereof is small as compared to that of hydrophobic silica. According to the present invention, titanium dioxide was added in order to prevent the ultraviolet rays from reaching the PET film and increasing the weatherability of backing sheet. When both hydrophobic silica and titanium dioxide were added as shown in Runs 12-17 with the amount of titanium dioxide being fixed to 25.3% by weight, which is considered to be sufficient for preventing the penetration of ultraviolet rays, the WVTR was further reduced as shown in the graph in FIG. 7. According to the present invention, the amount of hydrophobic silica added to the coating is preferably in the range of 2.5 to 15.0% by weight, and more preferably in the range of 7.5 to 12.5% as shown in FIGS. 5-7.

Therefore, according to the present invention, significantly different from the prior art in which silica is vapor deposited on the surface of a polyester resin substrate to decrease the WVTR and hydrolysable properties are imparted to the polyester resin substrate per se, the WVTR of the coating is lowered by the inclusion of hydrophobic silica thereto and the hydrolysis of substrate is prevented by decreasing the amount of vapor that reaches the substrate. Also, by adding titanium dioxide to the coating, it becomes possible to prevent the ultraviolet rays from reaching the substrate. Hence, the weatherability of the substrate is improved and the hydrolysis thereof is prevented.

In addition to significantly reducing WTVR and increasing the max permissible voltage, the addition of hydrophobically modified silica to the liquid formulation makes large scale processing of the film practical. Silica added to the liquid formulation enables the liquid formulation to be transferred from the pan to the applicator roll.

Example 4

Example 4 illustrates the preparation of another embodiment of the present invention; a Lumiflon®-based "patch kit" formulation.

The Lumiflon based patch kit formulation is preferably prepared from a formulation comprising 2 separate components: A and B.

Component A comprises of a mixture of a crosslinker (Isocyanate Desmodur N3300 (2.5 g, Bayer)) and a solvent (in this Example, xylene).

Component B is comprised of a mixture of a solvent, pigment and a fluorocopolymer. In this Example Component B is prepared as follows. A dispersing agent (Disperbyk 111 (0.25 g, BYK-Chemie)) is mixed with xylene, 14.1 g of Lumiflon® 200, pigment Ti-Pure® R101 (10 g, DuPont), Orgasol® 2002D (4.7 g, Arkema Inc) and a mixture of coloring agents (Microlith Blue, Microlith Yellow, Microlith Brown and Orasol Black). Different coloring agents can be added to match the color of the torn backing sheet.

Figure 4:
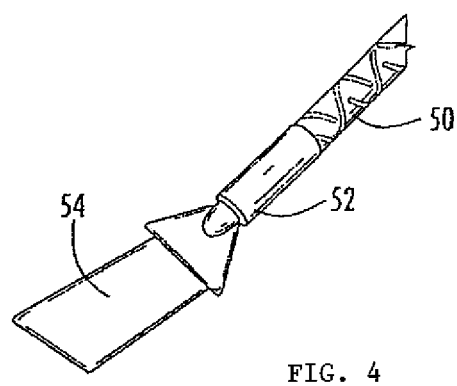
FIG. 4 illustrates an example of an applicator used with the patch kit.

In use, components A and B are placed into a twin-chamber syringe equipped with static mixer. The formulation is applied over damaged piece of backing sheet by using an applicator. One such applicator is available from Brandywine Associates and is illustrated in FIG. 4 where 50 is the mixer, 52 is an applicator tip, and 54 is the applied patch kit formulation. However, any type of applicator, such as a brush, may be used to apply the formulation.

The patch kit is compatible with many backing sheets, such as those prepared of prior art materials such as Tedlar®/Polyester/EVA or backing sheet made in accordance with the present invention. The applied formulation to a Tedlar based backing sheet was subjected to partial discharge test. The results of this test are summarized in Table 6.

TABLE 6

| Results of Partial Discharge Test | | | | |
|---|---|---|---|---|
| Laminate | Thickness mil | Outer layer thickness mil | Partial Discharge Test | Voltage max, VDC |
| Tedlar ®/ Polyester/EVA | 10.5 | 1.5 | IEC 60994-1, IEC 61730 | 1020 |

TABLE 6-continued

| Results of Partial Discharge Test | | | | |
|---|---|---|---|---|
| Laminate | Thickness mil | Outer layer thickness mil | Partial Discharge Test | Voltage max, VDC |
| Tedlar ®/ Polyester/EVA patched | 10.5 | 1.5 | IEC 60994-1, IEC 61730 | 1020 |

Additionally, this formulation demonstrated excellent adhesion to underlying layers of the backing sheet material, namely, 5B, by cross-cut tape test ASTM D 3359-97.

There will be various modifications, adjustments, and applications of the disclosed invention that will be apparent to those of skill in the art, and the present application is intended to cover such embodiments. Although the present invention has been described in the context of certain preferred embodiments, it is intended that the full scope of these be measured by reference to the scope of the following claims.

The disclosures of various publications, patents and patent applications that are cited herein are incorporated by reference in their entireties.

What is claimed is:

1. A method for promoting the adhesion of a fluoropolymer coating to a substrate for a backsheet for a photovoltaic module, the method comprising:
   coating a layer comprising fluoropolymer on a backsheet substrate,
   wherein the layer comprising fluoropolymer includes boron nitride in the range of 2 to 30 percent by weight to promote adhesion to the substrate to form the backing sheet.

2. The method of claim 1, wherein the substrate is made of polyester resin.

3. The method of claim 1, wherein the layer comprising the fluoropolymer includes hydrophobic silica.

4. The method of claim 1, wherein the amount of boron nitride contained in the layer comprising fluoropolymer is in the range of 2.5 to 12 percent by weight.

5. The method of claim 1, wherein the layer comprising fluoropolymer further includes a titanium dioxide.

6. The method of claim 1, wherein the layer comprising fluoropolymer includes a fluorocopolymer of chlorotrifluoroethylene (CTFE) and one or more alkyl vinyl ethers.

7. The method of claim 6, farther comprising a crosslinking agent mixed with the fluorocopolymer.

8. The method of claim 7, further comprising the step of adding one or more additional layers comprising one or more of polyester, polycarbonate, polyolefin, polyurethane, a liquid crystal polymer, aclar, aluminum, sputtered aluminum oxide polyester, sputtered silicon dioxide polyester, sputtered aluminum oxide polycarbonate, and sputtered silicon dioxide polycarbonate.

9. The method of claim 7, wherein the layer comprising the crosslinking agent mixes with the fluorocopolymer is applied to the polyester layer without adhesive.

10. The method of claim 9, further comprising adding an EVA layer.

11. The method of claim 2, wherein the boron nitride is included in the range of about 5 to 10 weight percent.

* * * * *